(12) United States Patent
Noh et al.

(10) Patent No.: US 11,329,173 B2
(45) Date of Patent: May 10, 2022

(54) TOUCH SENSOR, METHOD OF MANUFACTURING THE SAME AND IMAGE DISPLAY DEVICE INCLUDING THE SAME

(71) Applicant: DONGWOO FINE-CHEM CO., LTD., Jeollabuk-do (KR)

(72) Inventors: Sung Jin Noh, Gyeonggi-do (KR); Do Hyoung Kwon, Gyeonggi-do (KR); Jong Hee Kim, Gyeonggi-do (KR); Sang Jin Park, Gyeonggi-do (KR); Han Tae Ryu, Chungcheongbuk-do (KR); Jun Gu Lee, Gyeonggi-do (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 0 days.

(21) Appl. No.: 16/568,561

(22) Filed: Sep. 12, 2019

(65) Prior Publication Data

US 2020/0091358 A1 Mar. 19, 2020

(30) Foreign Application Priority Data

Sep. 17, 2018 (KR) .................. 10-2018-0110712

(51) Int. Cl.
*H01L 31/0224* (2006.01)
*G06F 3/041* (2006.01)
*G06F 3/044* (2006.01)

(52) U.S. Cl.
CPC ...... *H01L 31/022475* (2013.01); *G06F 3/044* (2013.01); *G06F 3/0412* (2013.01);
(Continued)

(58) Field of Classification Search
CPC ................ G06F 3/0443; G06F 3/044; G06F 2203/04112; G06F 3/0412;
(Continued)

(56) References Cited

U.S. PATENT DOCUMENTS

| 5,070,241 A | * | 12/1991 | Jack | .................. G01J 5/10 |
| | | | | 250/336.2 |
| 5,097,128 A | * | 3/1992 | Jack | .................. G01J 5/10 |
| | | | | 250/336.1 |

(Continued)

FOREIGN PATENT DOCUMENTS

| JP | WO-2018225114 | * 12/2018 | .......... H01L 29/786 |
| KR | 10-2013-0114820 A | 10/2013 | |

(Continued)

OTHER PUBLICATIONS

Office action dated Jul. 27, 2020 from Korean Patent Office in a counterpart Korean Patent Application No. 10-2018-0110712 (all the cited references are listed in this IDS.) (English translation is also submitted herewith.)

(Continued)

*Primary Examiner* — Vinh T Lam
(74) *Attorney, Agent, or Firm* — The PL Law Group, PLLC

(57) ABSTRACT

A touch sensor includes a substrate, and an electrode formed from a conductive stack structure including a first conductive oxide layer, a copper-containing metal layer and a second conductive oxide layer sequentially stacked from the substrate. The first conductive oxide layer and the second conductive oxide layer each include a copper-metal oxide. Chemical and mechanical stability of an electrode may be improved by the first and second conductive oxide layers.

11 Claims, 6 Drawing Sheets

(52) U.S. Cl.
CPC .............. *G06F 2203/04103* (2013.01); *G06F 2203/04112* (2013.01)

(58) Field of Classification Search
CPC .......... G06F 2203/04103; G06F 3/041; H01L 31/022475; H01L 31/0224
See application file for complete search history.

(56) References Cited

U.S. PATENT DOCUMENTS

| | | | |
|---|---|---|---|
| 2003/0019668 A1* | 1/2003 | Reade .................... | C30B 25/02 177/84 |
| 2009/0179155 A1* | 7/2009 | Weinberg ................. | G01T 1/24 250/370.01 |
| 2010/0167084 A1* | 7/2010 | Bhattacharya ......... | C25D 7/123 428/637 |
| 2012/0055532 A1* | 3/2012 | Wang .................. | H01L 31/1892 136/244 |
| 2015/0136214 A1* | 5/2015 | Islam .............. | H01L 31/022425 136/255 |
| 2015/0293629 A1* | 10/2015 | Ryu ..................... | G06F 3/0446 345/174 |
| 2015/0303368 A1* | 10/2015 | Huang ................... | H01L 39/02 505/150 |
| 2016/0334927 A1* | 11/2016 | Kim ..................... | H05K 1/0298 |
| 2017/0179364 A1* | 6/2017 | Schwartz .............. | H01L 39/126 |
| 2017/0351352 A1* | 12/2017 | Hsu ........................ | G06F 3/041 |

FOREIGN PATENT DOCUMENTS

| | | |
|---|---|---|
| KR | 10-2014-0003728 A | 1/2014 |
| KR | 10-2014-0092366 A | 7/2014 |
| KR | 10-2016-0125483 A | 10/2016 |
| KR | 10-2017-0020053 A | 2/2017 |
| KR | 10-2018-0101751 A | 9/2018 |

OTHER PUBLICATIONS

Office action dated Oct. 22, 2020 from Korean Patent Office in a counterpart Korean Patent Application No. 10-2018-0110712 (all the cited references are listed in this IDS.) (English translation is also submitted herewith.)

* cited by examiner

TOUCH SENSOR, METHOD OF MANUFACTURING THE SAME AND IMAGE DISPLAY DEVICE INCLUDING THE SAME

CROSS-REFERENCE TO RELATED APPLICATION AND CLAIM OF PRIORITY

This application claims priority to Korean Patent Application No. 10-2018-0110712 filed on Sep. 17, 2018 in the Korean Intellectual Property Office (KIPO), the entire disclosure of which is incorporated by reference herein.

BACKGROUND

1. Field

The present invention relates to a touch sensor, a method of manufacturing the same and an image display device including the same. More particularly, the present invention relates to a touch sensor including a multi-layered conductive layer, a method of manufacturing the same and an image display device including the same.

2. Description of the Related Art

As information technologies are being developed, various demands in display devices having thinner dimension, light-weight, high efficiency in power consumption, etc., are increasing. The display device may include a flat panel display device such as a liquid crystal display (LCD) device, a plasma display panel (PDP) device, an electro-luminescent display device, an organic light emitting diode (OLED) display device, etc.

A touch panel or a touch sensor capable of inputting a user's direction by selecting an instruction displayed on a screen with a finger or an inputting tool is also developed. The touch panel or the touch sensor may be combined with the display device so that display and information input functions may be implemented in one electronic device.

The touch sensor may include sensing electrodes for sensing a touch input from the user, and may further include conductive patterns such as wirings, pads, etc., connected to the sensing electrodes. In a fabrication of the touch sensor, when the sensing electrodes are exposed to an external environment, the sensing electrodes may be oxidized to result in physical damages and increase of a resistance. Further, the sensing electrodes or the conductive patterns may be delaminated or separated from a substrate if a sufficient adhesion to the substrate is not maintained.

The touch sensor may further include an insulation structure. The conductive pattern or electrodes may be viewed by differences of reflectivity and color sense between the conductive pattern and the insulation structure to degrade an image quality of the image display device.

Thus, mechanical and chemical stability and optical property of the sensing electrodes and the conductive pattern are required in the fabrication of the touch sensor. For example, as disclosed in Korean Patent Application Publication No. 2014-0092366, various image display devices combined with a touch screen panel including a touch sensor has been developed recently.

SUMMARY

According to an aspect of the present invention, there is provided a touch sensor having improved chemical, mechanical and optical properties.

According to an aspect of the present invention, there is provided a method of manufacturing a touch sensor having improved chemical, mechanical and optical properties.

According to an aspect of the present invention, there is provided a window stack structure and an image display device including the touch sensor.

The above aspects of the present inventive concepts will be achieved by the following features or constructions:

(1) A touch sensor, comprising a substrate; and an electrode formed from a conductive stack structure including a first conductive oxide layer, a copper-containing metal layer and a second conductive oxide layer sequentially stacked from the substrate, wherein the first conductive oxide layer and the second conductive oxide layer each includes a copper-metal oxide.

(2) The touch sensor according to the above (1), wherein the electrode includes sensing electrodes and a bridge electrode electrically connecting neighboring ones of the sensing electrodes, wherein at least one of the sensing electrode and the bridge electrode includes the conductive stack structure.

(3) The touch sensor according to the above (2), wherein the sensing electrodes includes first sensing electrodes arranged along a first direction parallel to a top surface of the substrate; and second sensing electrodes integrally connected to each other along a second direction parallel to the top surface of the substrate and perpendicular to the first direction.

(4) The touch sensor according to the above (3), further comprising an insulation layer at least partially covering the second sensing electrodes, wherein the bridge electrode is disposed on the insulation layer to electrically connect the first sensing electrodes neighboring in the first direction to each other.

(5) The touch sensor according to the above (4), wherein the bridge electrode and the sensing electrodes both include the conductive stack structure.

(6) The touch sensor according to the above (3), further comprising an insulation layer partially covering the bridge electrode, wherein the first sensing electrodes and the second sensing electrodes are disposed on the insulation layer, and the first sensing electrodes neighboring in the first direction are electrically connected to each other via a portion of the bridge electrode exposed through the insulation layer.

(7) The touch sensor according to the above (6), wherein the bridge electrode includes the conductive stack structure and the sensing electrodes include a transparent conductive oxide.

(8) The touch sensor according to the above (2), wherein the electrode further includes a trace electrically connected to the sensing electrodes and a pad connected to a terminal of the trace, wherein at least one of the trace and the pad includes the conductive stack structure.

(9) The touch sensor according to the above (1), wherein the first conductive oxide layer and the second conductive oxide layer each includes a copper-calcium oxide (Cu—Ca—O) and the copper-containing metal layer includes copper-calcium (Cu—Ca).

(10) The touch sensor according to the above (1), wherein each thickness of the first conductive oxide layer and the second conductive oxide layer is in a range from 100 Å to 600 Å, and a thickness of the copper-containing metal layer is in a range from 1000 Å to 3000 Å.

(11) A method of manufacturing a touch sensor, comprising depositing copper and a metal except for copper on a substrate together with an oxygen injection to form a first conductive oxide layer; ceasing the oxygen injection while maintaining the deposition to form a copper-containing metal layer on the first conductive oxide layer; performing the oxygen injection again while maintaining the deposition to form a second conductive oxide layer on the copper-containing metal layer such that a conductive stack structure is formed; and etching the conductive stack structure to form an electrode.

(12) The method according to the above (11), wherein forming the copper-containing metal layer is performed at a temperature in a range from 90° C. to 150° C.

(13) The method according to the above (12), wherein forming the first conductive oxide layer and forming the second conductive oxide layer are performed at a temperature in a range from 90° C. to 150° C.

(14) The method according to the above (11), wherein forming the first conductive oxide layer, forming the copper-containing metal layer and forming the second conductive oxide layer are continuously performed by an in-situ process in the same process chamber.

(15) The method according to the above (11), wherein forming the first conductive oxide layer, forming the copper-containing metal layer and forming the second conductive oxide layer are performed by an in-line process continuously in a plurality of process chambers

(16) The method according to the above (11), wherein the metal except for copper includes calcium.

(17) An image display device, comprising a display panel; and a touch sensor according to any one of the above (1) to (10) on the display panel.

(18) The image display device according to the above (17), further comprising an adhesive layer combining the display panel and the touch sensor with each other.

According to exemplary embodiments as described above, the touch sensor may include a conductive stack structure that may include a first conductive oxide layer and a second conductive oxide layer each containing a copper-metal oxide represented by Cu—M—O, and a copper-containing metal layer formed between the first and second conductive oxide layers.

Chemical stability with respect to an external environment and an adhesion to a substrate may be enhanced by the first and second conductive oxide layers while suppressing an increase of a channel resistance by the copper-containing metal layer. Additionally, a reflectivity of a sensing electrode may be reduced to prevent electrodes from being viewed by a user.

The conductive stack structure may be formed by an in-situ process in a deposition process chamber such as a sputtering process chamber while adjusting a supply of oxygen ($O_2$). Thus, process convenience and reliability may be also improved.

DETAILED DESCRIPTION

According to exemplary embodiments of the present invention, there is provided a touch sensor having improved chemical, mechanical and optical reliability. The touch sensor may include electrodes or wirings formed from a conductive stack structure which may include a first conductive oxide layer and a second conductive oxide layer each containing a copper-metal oxide, and a copper-containing metal layer formed between the first and second conductive oxide layers. A window stack structure and an image display device including the touch sensor are also provided.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Figure 1:
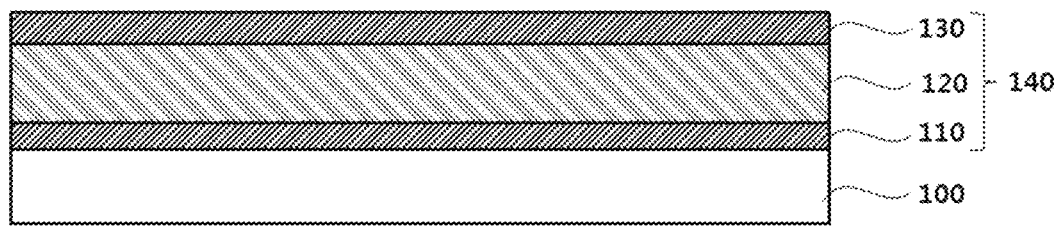
FIG. 1 is a cross-sectional view illustrating a conductive stack structure of a touch sensor in accordance with exemplary embodiments.

FIG. 1 is a cross-sectional view illustrating a conductive stack structure of a touch sensor in accordance with exemplary embodiments.

Referring to FIG. 1, a conductive stack structure 140 may include a first conductive oxide layer 110, a copper-containing metal layer 120 and a second conductive oxide layer 130 sequentially formed on a substrate 100.

The substrate 100 may serve as a base layer for formation of conductive patterns including sensing electrodes of a touch sensor. For example, the substrate 100 may include a film-type substrate or an object on which the conductive patterns are formed. In some embodiments, a display panel on which the conductive patterns may be directly formed may serve as the substrate 100.

The substrate 100 may include a substrate or a film commonly used in a touch sensor. For example, the substrate 100 may include glass, polymer and/or an inorganic insulation material. The polymer may include, e.g., cyclo olefin polymer (COP), polyethylene terephthalate (PET), polyacrylate (PAR), polyether imide (PEI), polyethylene naphthalate (PEN), polyphenylene sulfide (PPS), polyallylate, polyimide (PI), cellulose acetate propionate (CAP), polyether sulfone (PES), cellulose triacetate (TAC), polycarbonate (PC), cyclo olefin copolymer (COC), polymethylmethacrylate (PMMA), etc. The inorganic insulation material may include, e.g., silicon oxide, silicon nitride, silicon oxynitride, a metal oxide, etc.

A layer or a film member in an image display device to which the touch sensor is applied may also serve as the substrate 100. For example, an encapsulation layer or a passivation layer included in the display panel may serve as the substrate 100.

The first conductive oxide layer 110 and the second conductive oxide layer 130 may include a copper-metal oxide. For example, the copper-metal oxide may be designated as Cu—M—O, and M may represent at least one metal element except for copper.

In exemplary embodiments, M may include calcium (Ca), magnesium (Mg), aluminum (Al), titanium (Ti), vanadium (V), chromium (Cr), zinc (Zn), strontium (Sr), silver (Ag), barium (Ba), zirconium (Zr), niobium (Nb), molybdenum (Mo), gallium (Ga), etc. These may be used alone or in a combination thereof.

In a preferable embodiment, M may include Ca in consideration of an interaction or a bond with copper and improvement of conductivity.

The copper-metal oxide may be a conductive oxide such as indium-tin-oxide (ITO). For example, an oxygen atom in the copper-metal oxide may be present as an alloy or a dopant.

The first conductive oxide layer 110 may be directly formed on a top surface of the substrate 100. An adhesion or bonding strength of a conductive layer may be enhanced by the first conductive oxide layer 100 compared to that of a metal layer directly formed on the substrate 100.

The copper-containing metal layer 120 may include copper and at least one metal except for copper. At least one metal may include, e.g., calcium (Ca), magnesium (Mg), aluminum (Al), titanium (Ti), vanadium (V), chromium (Cr), zinc (Zn), strontium (Sr), silver (Ag), barium (Ba), zirconium (Zr), niobium (Nb), molybdenum (Mo), gallium (Ga), etc.

In a preferable embodiment, the copper-containing metal layer 120 may include Ca in consideration of compatibility with the first and second conductive oxide layers 110 and 130, and an interaction or a bond with copper. For example, Ca may be included as a Cu—Ca alloy or a dopant of Cu.

The metal element such as Ca may be present together with Cu so that an oxidation of Cu may be suppressed while maintaining a low resistance of Cu. Thus, chemical stability of the conductive stack structure 140 may be improved while maintaining a low resistance thereof.

The copper-containing metal layer 120 may be sandwiched between the first conductive oxide layer 110 and the second conductive oxide layer 130. Oxidation or corrosion of the copper-containing metal layer 120 by an external air may be prevented by the second conductive oxide layer 130. As described above, an adhesion of the conductive stack structure 140 may be enhanced by the first conductive oxide layer 110. Additionally, organic materials, moistures, etc., that may be transferred from the substrate 100 from the copper-containing metal layer 120 may be blocked by the first conductive oxide layer 110.

Accordingly, the first conductive oxide layer 110 and the second conductive oxide layer 130 may substantially serve as conductive barrier layers of the copper-containing metal layer 120.

Further, upper and lower surfaces of the copper-containing metal layer 120 may be covered by the first conductive oxide layer 110 and the second conductive oxide layer 130 so that a reflectivity of the conductive stack structure 140 may be reduced. Thus, a conductive pattern (e.g., a sensing electrode of a touch sensor) formed from the conductive stack structure 140 may be prevented from being viewed.

In exemplary embodiments, a thickness of the copper-containing metal layer 120 may be greater than each thickness of the first conductive oxide layer 110 and the second conductive oxide layer 130. In some embodiments, the thickness of the copper-containing metal layer 120 may be in a range from about 1000 Å to about 3000 Å, and each thickness of the first conductive oxide layer 110 and the second conductive oxide layer 130 may be in a range from about 100 Å to about 600 Å. Within the above range, sufficient sensitivity and low resistance may be easily achieved from the copper-containing metal layer 120.

FIGS. 2 to 5 are schematic cross-sectional views illustrating a method of manufacturing a conductive stack structure included in a touch sensor in accordance with exemplary embodiments. Hereinafter, an exemplary embodiment that the first and second conductive oxide layers 110 and 130 include Cu—Ca—O and the copper-containing metal layer 120 includes Cu—Ca will be described in detail with reference to FIGS. 2 to 5.

Figure 2:
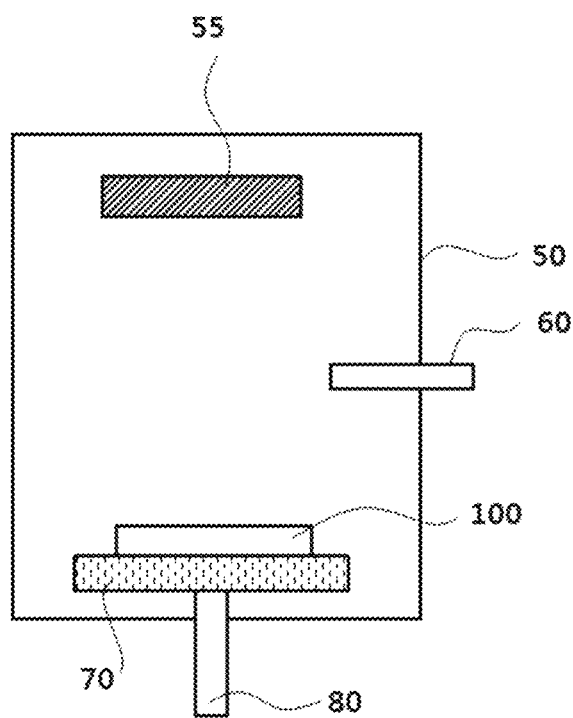
FIGS. 2 to 5 are schematic cross-sectional views illustrating a method of manufacturing a conductive stack structure included in a touch sensor in accordance with exemplary embodiments.

Referring to FIG. 2, a substrate 100 may be loaded on a process chamber 50. In exemplary embodiments, the process chamber 50 may be a sputtering process chamber.

The substrate 100 may be placed on a stage 70 rotatable by, e.g., a chuck 80. A metal target 55 for a deposition of metal elements may be placed at an upper portion of the process chamber 50. A gas flow path 60 may be connected with an outside of the process chamber 50 to provide a deposition gas.

As illustrated in FIG. 2, the gas flow path 60 may be combined with a lateral portion of the process chamber 50. In an embodiment, the gas flow path 60 may be combined with the upper portion of the process chamber 50 to be more adjacent to the metal target 55.

Figure 3:
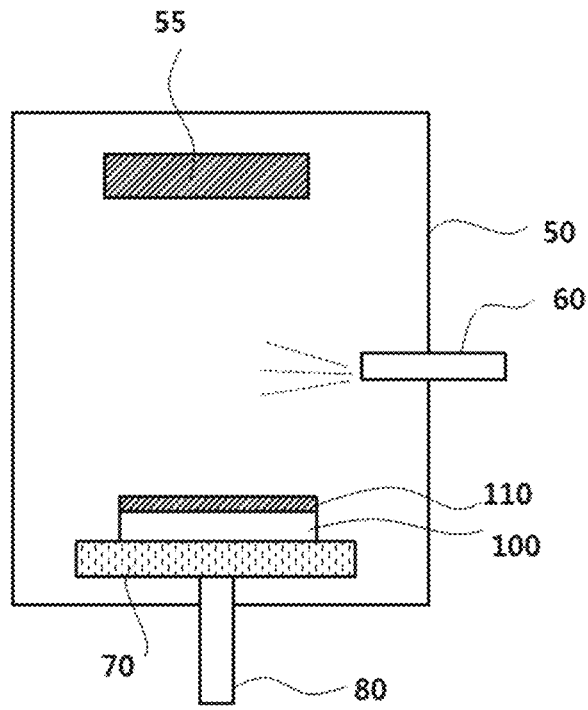

Referring to FIG. 3, a first conductive oxide layer 110 may be formed on the substrate 100.

For example, a power may be applied to the metal target 55 to initiate the deposition of the metal elements. The metal target 55 may include a copper-calcium target or may individually include a copper target and a calcium target.

Oxygen ($O_2$) may be provided into the process chamber 50 through the gas flow path 60 during the deposition of the metal elements to form an oxygen atmosphere. Accordingly, the first conductive oxide layer 110 including a copper-calcium oxide represented by Cu—Ca—O may be formed on the substrate 100.

In some embodiments, a power may be also applied through the chuck 80 and the deposition may be performed while rotating the stage 70. Accordingly, the metal elements and oxygen present in the process chamber 50 may be induced onto the substrate 100, and uniform deposition may be implemented throughout an entire area of the substrate 100.

For example, a carrier gas such as argon (Ar) or nitrogen ($N_2$) may be also supplied through the gas flow path 60. In an embodiment, an additional flow path may be placed for the supply of the carrier gas.

Figure 4:
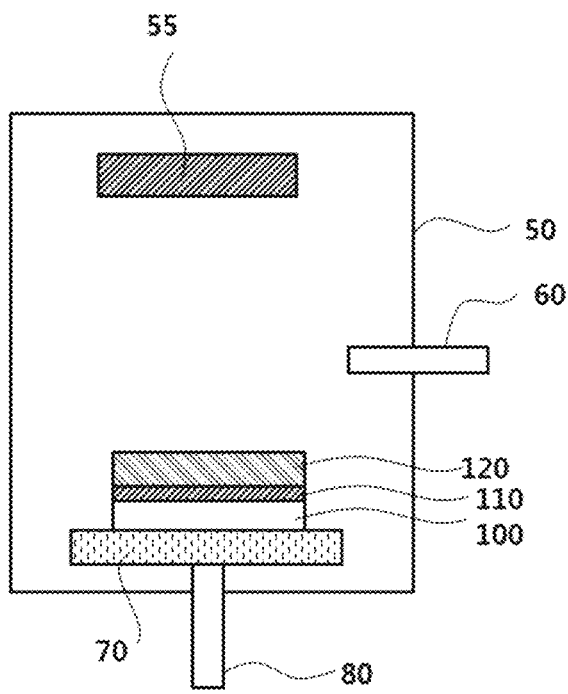

Referring to FIG. 4, a copper-containing metal layer 120 may be formed on the first conductive oxide layer 110.

In exemplary embodiments, the deposition of copper and calcium via the metal target 55 may be continuously maintained, and an injection of oxygen through the gas flow path 60 may be ceased or interrupted. Accordingly, the copper-containing metal layer 120 including copper-calcium and substantially devoid of oxygen may be formed.

Figure 5:
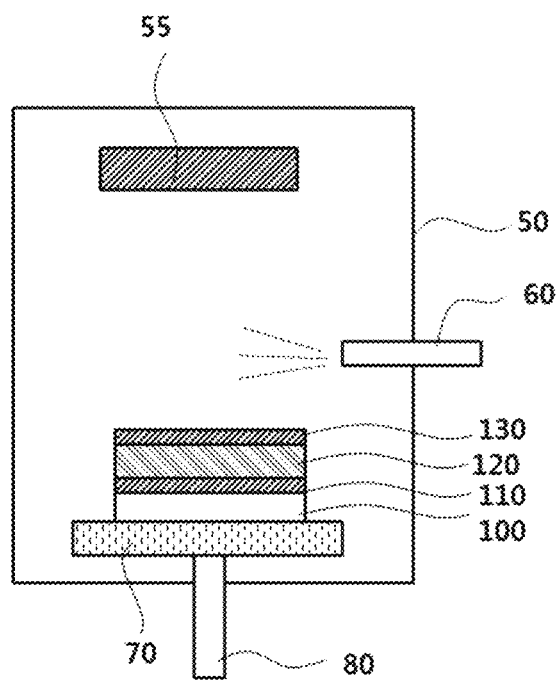

Referring to FIG. 5, an oxygen supply may be performed again while maintaining continuously the deposition of copper and calcium via the metal target 55. Accordingly, the second conductive oxide layer 130 including a copper-calcium oxide may be formed on the copper-containing metal layer 120 such that a conductive stack structure having a triple-layered structure where the first conductive oxide layer 110, the copper-containing metal layer 120 and the second conductive oxide layer 130 may be sequentially stacked may be achieved.

As described above, the deposition of the metal elements may be continuously performed in the single process chamber 50 and the oxygen supply may be controlled to form the multi-layered conductive stack structure by an in-situ process. Thus, process efficiency and productivity may be enhanced and a thickness of each layer may be finely and easily controlled by the oxygen injection.

In some embodiments, a temperature in the process chamber 50 may be increased in a range from about 90° C. to about 150° C. during the formation of the copper-containing metal layer 120 (the process of FIG. 4).

In an embodiment, the formation of the first conductive oxide layer 110 as described with reference to FIG. 3 and the formation of the second conductive oxide layer 130 as described with reference to FIG. 5 may be performed at a room temperature, and a process temperature may be selectively increased during the formation of the copper-containing metal layer 120 (the process of FIG. 4) in the above range. In this case, a Cu—Ca crystalline structure in the copper-containing metal layer 120 may be stabilized so that resistance may be further decreased, and a reflectivity and a color sense may be also reduced.

In an embodiment, the process temperature may be maintained within the above range throughout the processes of FIGS. 3 to 5.

In some embodiments, the conductive stack structure may be formed by, e.g., a chemical vapor deposition (CVD) process using precursor compounds. For example, the oxygen injection through the gas flow path 60 may be controlled while providing a copper precursor compound and a calcium precursor compound in the process chamber to form the above-mentioned conductive stack structure.

In some embodiments, the conductive stack structure may be formed by an in-line process where the first conductive oxide layer 110, the copper-containing metal layer 120 and the second conductive oxide layer 130 may be sequentially formed by a continuous transfer in a plurality of process chambers.

For example, the substrate 100 may be transferred continuously in a first process chamber performing a metal deposition and an oxygen injection, a second process chamber only performing the metal deposition and a third process chamber performing the metal deposition and the oxygen injection to form the conductive stack structure.

Figure 6:
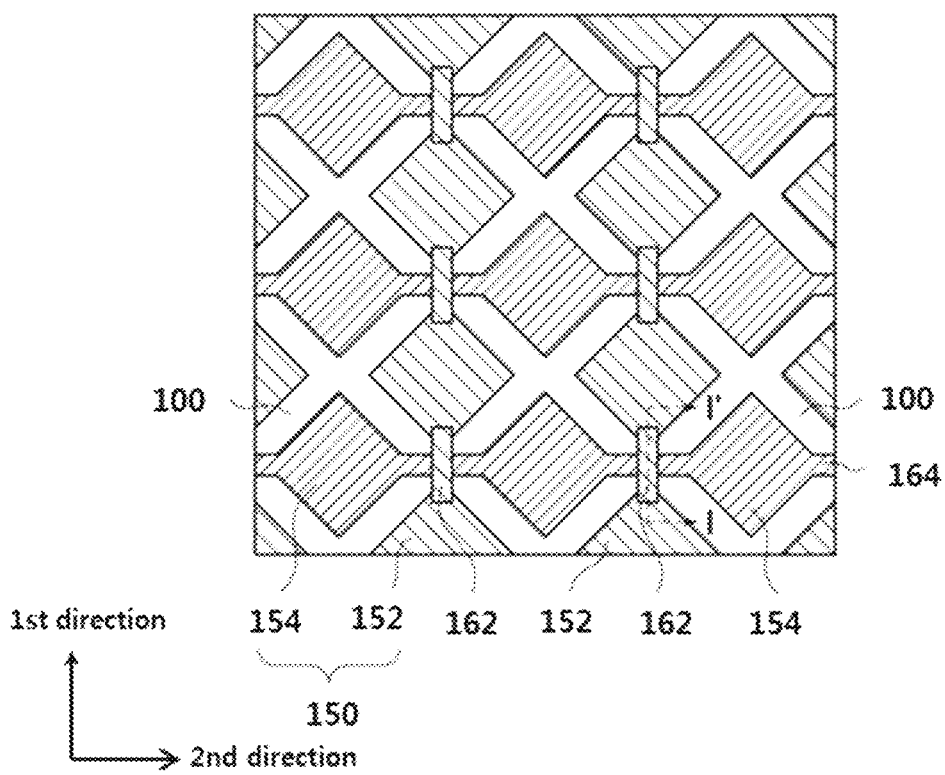
FIGS. 6 and 7 are a top planar view and a cross-sectional view, respectively, illustrating a touch sensor in accordance with exemplary embodiments.
Figure 7:
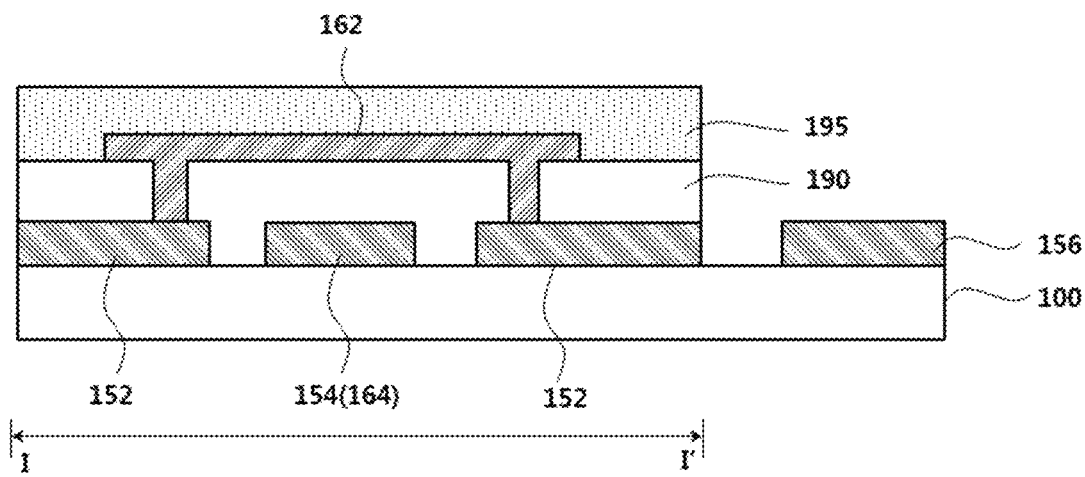

FIGS. 6 and 7 are a top planar view and a cross-sectional view, respectively, illustrating a touch sensor in accordance with exemplary embodiments. For example, FIG. 7 includes a cross-sectional view taken along a line I-I' of FIG. 6.

For convenience of descriptions, an illustration of an insulation layer 190 is omitted in FIG. 6. Two directions parallel to a top surface of a substrate 100 and perpendicular to each other may be designated as a first direction and a second direction.

Referring to FIGS. 6 and 7, a touch sensor may include sensing electrodes 150 and a pad 156 arranged on the substrate 100.

The sensing electrodes 150 may include a first sensing electrode 152 and a second sensing electrode 154. For example, the sensing electrodes 150 may be arranged to be operated by a mutual capacitance type.

For example, the first sensing electrodes 152 may be arranged along the first direction. Each first sensing electrode 152 may have an island pattern shape, and the first sensing electrodes 152 neighboring in the first direction may be electrically connected to each other by a bridge electrode 162.

Accordingly, a first sensing electrode column extending in the first direction may be defined, and a plurality of the first sensing electrode columns may be arranged along the second direction.

The second sensing electrodes 154 may be arranged along the second direction. The second sensing electrodes 154 neighboring in the second direction may be connected to each other by a connecting portion 164. The second sensing electrodes 154 and the connecting portion 164 may be integrally connected to each other to be a substantially unitary member. In this case, the second sensing electrodes 154 and the connecting portion 164 may be formed by patterning the same conductive layer to be placed at the same layer or at the same level.

Accordingly, a second sensing electrode row extending in the second direction may be defined, and a plurality of the second sensing electrode rows may be arranged along the first direction.

The insulation layer 190 may be formed on the substrate 100 to at least partially cover the sensing electrodes 150 and the connecting portion 164. The bridge electrode 162 may be disposed on the insulation layer 190 so that the first sensing electrodes 152 neighboring each other may be electrically connected to each other, e.g., via contact holes formed in the insulation layer 190.

A passivation layer 195 may be formed on the insulation layer 190 and the bridge electrode 162.

The insulation layer 190 and/or the passivation layer 195 may be formed of an inorganic insulation material such as silicon oxide, silicon nitride, etc., or an organic insulation material such as an acryl-based resin, a siloxane-based resin.

In exemplary embodiments, the sensing electrodes 150 may be formed from the conductive stack structure 140 as described with reference to FIG. 1. For example, the conductive stack structure 140 may be formed on the substrate 100 by the process as described with reference to FIGS. 2 to 5, and then may be etched to form the sensing electrodes 150 including the connecting portion 164.

Accordingly, the sensing electrode 150 may have, e.g., a triple-layered structure including the first conductive oxide layer 110, the copper-containing metal layer 120 and the second conductive oxide layer 130. The first and second conductive oxide layers 110 and 130 may serve as an oxide and corrosion barrier with respect to the copper-containing metal layer 120. Further, an adhesion of the sensing electrode 150 to the substrate 100 may be enhanced by the first conductive oxide layer 110.

Thus, the sensing electrodes 150 having improved chemical and mechanical stability may be obtained while maintaining a channel resistance and a sensitivity by the copper-containing metal layer 120. Further, an upper surface of the copper-containing metal layer 120 may be covered by the second conductive oxide layer 130 so that a reflectivity of the sensing electrode 150 may be reduced. Thus, the sensing electrodes 150 may be prevented from being viewed by a user, and degradation of an image quality from an image display device may be also avoided.

In some embodiments, the bridge electrode 162 may be also formed from the conductive stack structure 140.

For example, as illustrated in FIG. 7, the pad 156 may be disposed at an end portion of the touch sensor. The pad 156 may be formed on the substrate 100, and may be electrically connected to the sensing electrode 150. The pad 156 may be electrically connected to each of the first sensing electrode column and the second sensing electrode row via a trace (not illustrated), and the pad 156 may be connected to a terminal of the trace.

In some embodiments, the pad 156 may be also formed from the conductive stack structure 140. For example, the pad 156 may be formed by etching the conductive stack structure together with the sensing electrodes 150.

In an embodiment, the insulation layer 190 and the passivation layer 195 may be partially removed to form an opening through which the pad 156 may be exposed. For example, the pad 156 and a flexible printed circuit board (FPCB) may be bonded via the opening.

Figure 8:
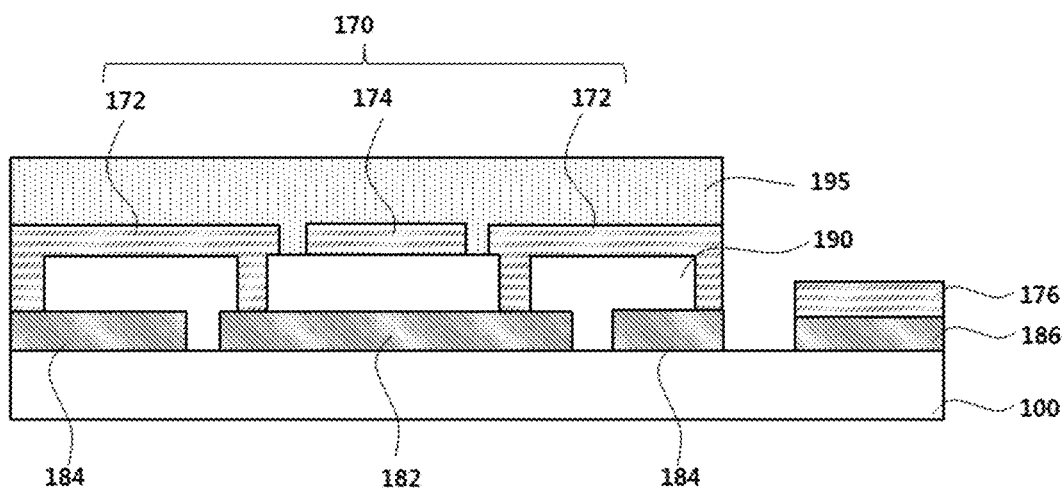
FIG. 8 is a schematic cross-sectional view illustrating a touch sensor in accordance with some exemplary embodiments.

FIG. 8 is a schematic cross-sectional view illustrating a touch sensor in accordance with some exemplary embodiments. For example, FIG. 8 illustrates a touch sensor having a bottom bridge structure.

Referring to FIG. 8, a bridge electrode 182 may be formed on an upper surface of the substrate 100, and an insulation layer 190 may be formed on the bridge electrode 182. The insulation layer 190 may partially cover the bridge electrode 182. For example, a top surface of the bridge electrode 182 may be partially exposed through a contact hole formed in the insulation layer 190.

Sensing electrodes 170 may be formed on the insulation layer 190, and may include first and second sensing electrodes 172 and 174. For example, the first sensing electrodes 172 may fill the contact hole included in the insulation layer 190 and may be electrically connected to each other via the bridge electrode 182.

The second sensing electrodes 174 may be disposed on the insulation layer 190, and may be insulated from the first sensing electrode 172 and the bridge electrode 182.

In exemplary embodiments, the bridge electrode 182 may be formed from the conductive stack structure as described with reference to FIG. 1. For example, the conductive stack structure 140 may be formed on the substrate 100 by the processes as described with reference to FIGS. 2 to 5, and then may be etched to form the bridge electrode 182. As described above, a channel resistance of the bridge electrode 182 may be reduced by the copper-containing metal layer 120, and an adhesion and chemical/mechanical stability of the bridge electrode 182 may be enhanced by the first and second conductive oxide layers 110 and 130.

In some embodiments, a trace 184 may be formed from the conductive stack structure 140 together with the bridge electrode 182. The trace 184 may be electrically connected to the sensing electrodes 170 at, e.g., a peripheral portion of the touch sensor or the substrate 100.

In some embodiments, the sensing electrodes 170 may include a transparent conductive oxide. For example, the sensing electrodes 170 may include, e.g., indium tin oxide (ITO), indium zinc oxide (IZO), zinc oxide (ZnO), indium zinc tin oxide (IZTO), cadmium tin oxide (CTO), etc. Accordingly, a transmittance of the sensing electrodes 170 may be improved, and the sensing electrodes 170 may be prevented from being viewed by the user.

Pads may be formed at an end portion of the touch sensor or the substrate 100. In some embodiments, the pads may include a first conductive pattern 186 and a second conductive pattern 176.

The first conductive pattern 186 may be formed from the conductive stack structure 140 together with the bridge electrode 182. The first conductive pattern 186 may be connected to a terminal end of the trace 184, and the trace 184 may be also formed from the conductive stack structure as described above.

The second conductive pattern 176 may be formed of the transparent conductive oxide together with the sensing electrodes 170.

According to exemplary embodiments of the present invention, an image display device including the touch sensor or the touch screen panel as described above is provided.

Figure 9:
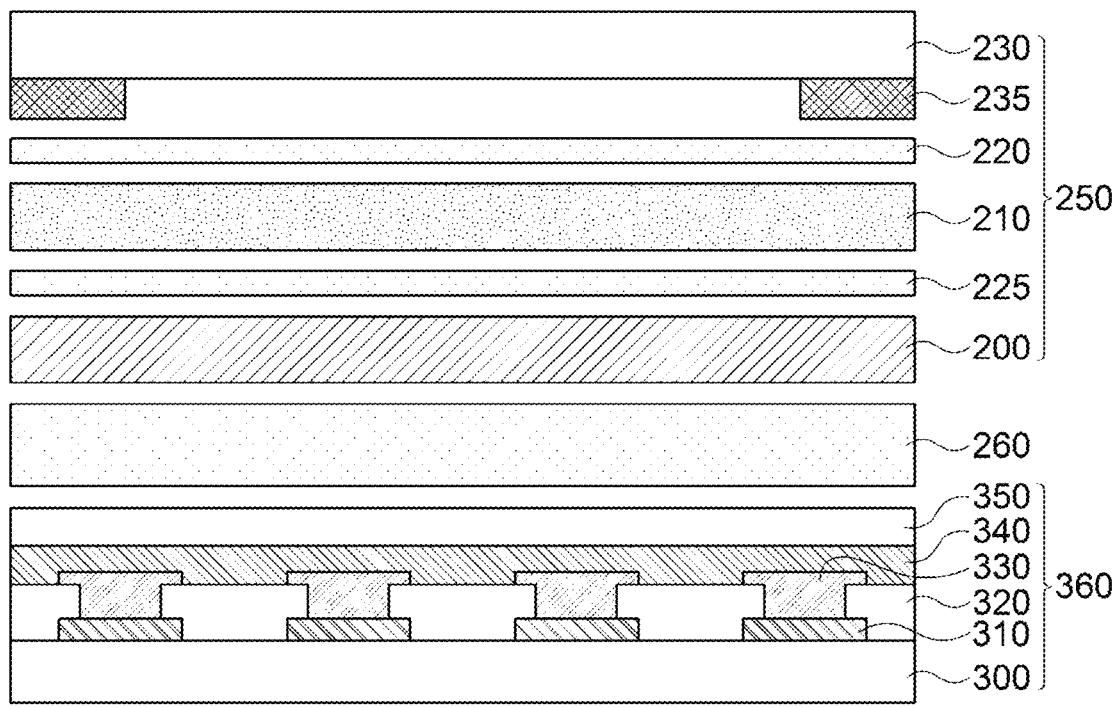
FIG. 9 is a schematic cross-sectional view illustrating a window stack structure and an image display device including a touch sensor in accordance with exemplary embodiments.

FIG. 9 is a schematic cross-sectional view illustrating a window stack structure and an image display device including a touch sensor in accordance with exemplary embodiments.

A window stack structure 250 may include a window substrate 230, a polarizing layer 210 and a touch sensor 200 according to exemplary embodiments as described above.

The window substrate 230 may include, e.g., a hard coating film. In an embodiment, a light-shielding pattern 235 may be formed on a peripheral portion of a surface of the window substrate 230. The light-shielding pattern 235 may include a color-printed pattern, and may have a single-layered or multi-layered structure. A bezel portion or a non-display region of the image display device may be defined by the light-shielding pattern 235.

The polarizing layer 210 may include a coating-type polarizer or a polarizing plate. The coating-type polarizer may include a liquid crystal coating layer that may include a cross-linkable liquid crystal compound and a dichroic dye. In this case, the polarizing layer 210 may include an alignment layer for providing an orientation of the liquid crystal coating layer.

For example, the polarizing plate may include a polyvinyl alcohol-based polarizer and a protective film attached to at least one surface of the polyvinyl alcohol-based polarizer.

The polarizing layer 210 may be directly attached to the surface of the window substrate 230 or may be attached via a first adhesive layer 220.

The touch sensor 200 may be included in the window stack structure 250 as a film or a panel. In an embodiment, the touch sensor 200 may be combined with the polarizing layer 210 via a second adhesive layer 225.

As illustrated in FIG. 9, the window substrate 230, the polarizing layer 210 and the touch sensor 200 may be sequentially positioned from a viewer's side. In this case, sensing electrodes of the touch sensor 200 may be disposed under the polarizing layer 210 so that electrode patterns may be effectively prevented from being seen by the viewer.

If the touch sensor 200 includes a substrate, the substrate may include, e.g., triacetyl cellulose, cycloolefin, cycloolefin copolymer, polynorbornene copolymer, etc., and may have an in-plane retardation of ±2.5 nm or less.

In an embodiment, the touch sensor 200 may be directly transferred to the window substrate 230 or the polarizing layer 210. In an embodiment, the window substrate 230, the touch sensor 200 and the polarizing layer 210 may be sequentially positioned from the viewer's side.

The image display device may include a display panel 360 and the window stack structure 250 disposed on the display panel 360.

The display panel 360 may include a pixel electrode 310, a pixel defining layer 320, a display layer 330, an opposing electrode 340 and an encapsulation layer 350 disposed on a panel substrate 300.

A pixel circuit including a thin film transistor (TFT) may be formed on the panel substrate 300, and insulation layer covering the pixel circuit may be formed. The pixel electrode 310 may be electrically connected to, e.g., a drain electrode of the TFT on the insulation layer.

The pixel defining layer 320 may be formed on the insulation layer, and the pixel electrode 310 may be exposed through the pixel defining layer 320 such that a pixel region may be defined. The display layer 330 may be formed on the pixel electrode 310, and the display layer 330 may include, e.g., a liquid crystal layer or an organic light emitting layer.

The opposing electrode 340 may be disposed on the pixel defining layer 320 and the display layer 330. The opposing electrode 340 may serve as, e.g., a common electrode or a cathode of the image display device. The encapsulation layer 350 may be disposed on the opposing electrode 340 to protect the display panel 360.

In some embodiments, the display panel 360 and the window stack structure 250 may be combined with each other through an adhesive layer 260. For example, a thickness of the adhesive layer 260 may be greater than each thickness of the first adhesive layer 220 and the second adhesive layer 225. A viscoelasticity of the adhesive layer 360 may be about 0.2 MPa or less at a temperature ranging from −20° C. to 80° C. In this case, a noise from the display panel 360 may be blocked, and an interface stress while being bent may be alleviated so that damages of the window stack structure 250 may be avoided. In an embodiment, the viscoelasticity of the adhesive layer 260 may be in a range from about 0.01 MPa to about 0.15 MPa.

The touch sensor 200 may include electrodes formed from the conductive stack structure 140 including a triple-layered structure according to exemplary embodiments as described above. Accordingly, the electrodes may be prevented from being viewed, and thus degradation of an image quality from the display panel 360 may be also prevented. Further, a touch sensing reliability may be improved.

Hereinafter, preferred embodiments are proposed to more concretely describe the present invention. However, the following examples are only given for illustrating the present invention and those skilled in the related art will obviously understand that these examples do not restrict the appended claims but various alterations and modifications are possible within the scope and spirit of the present invention. Such alterations and modifications are duly included in the appended claims.

Experimental Example 1: Evaluation on Reflectivity and Color Sense

Example 1

A glass substrate was loaded in a sputtering process chamber (chamber temperature: 120° C.), and a deposition using a CuCa target (Ca ratio relative to Cu: 1 atomic %) was initiated while an oxygen gas was injected together with Ar as a carrier gas with a total pressure of 0.5 to 0.7 Pa to form a first conductive oxide layer. The oxygen injection was performed until a thickness of the first conductive oxide layer reached 600 Å. After ceasing the oxygen injection, the CuCa deposition was continuously maintained to form a copper-containing metal layer having a thickness of 1100 Å. The oxygen injection was performed again to form a second conductive oxide layer having a thickness of 600 Å. Accordingly, an electrode having a triple-layered structure represented by CuCaO/CuCa/CuCaO was obtained.

Example 2

Processes the same as those of Example 1 except that a process temperature was controlled to a room temperature (23° C.) to form an electrode.

Comparative Example 1

The oxygen injection was omitted in the processes of Example 1 to form a CuCa electrode having a thickness of 2300 Å.

Reflectivity and color sense of each electrode of Examples and Comparative Example were measured using KONICA MINOLTA CM-3600A, and the results are shown in Table 1 below.

TABLE 1

|  | Y(D65) | L*(D65) | a*(D65) | b*(D65) | u'(D65) | v'(d65) | Reflectivity Ratio relative to Comparative Example |
|---|---|---|---|---|---|---|---|
| Example 1 | 54.01 | 78.47 | 10.29 | 12.44 | 0.22 | 0.49 | 0.76 |
| Example 2 | 59.12 | 81.36 | 10.44 | 14.83 | 0.22 | 0.49 | 0.83 |
| Comparative Example 1 | 71.28 | 87.62 | 13.90 | 16.50 | 0.23 | 0.49 | 1 |

Y: Luminance value in CIE 1931 color coordinate system (reflectivity)
L*: Brightness value in CIELab color coordinate system
a*: Color sense coordinate in CIELab color coordinate system (+red/−green)
b*: Color sense coordinate in CIELab color coordinate system (+yellow/−blue)
u': Color sense coordinate in CIE 1976 color coordinate system
v': Color sense coordinate in CIE 1976 color coordinate system
D65: Daylight 6500 K color temperature Referring to Table 1, reflectivity values in Examples were remarkably reduced compared to that in Comparative Example by forming the conductive oxide layers, and color related numerical values were also generally reduced to prevent the electrodes from being viewed. Further, reflectivity and color sense were relatively reduced in Example 1 performed at the process temperature of 120° C.

Experimental Example 2: Evaluation of Adhesion/Corrosion

Adhesions of the electrodes of Examples 1 and 2 and Comparative Example 1 to the substrate were evaluated by a standard of ISO 2409 (Standard Test Methods for Measuring Adhesion by Tape Test). The electrodes of Examples 1 and 2 and Comparative Example 1 were left in conditions of 85% relative humidity and 85° C. for 500 hours, and then generation of electrode corrosion was observed.

The results are shown in Table 2. SEM images of the electrodes after the evaluation of adhesion are also shown in FIG. 10A (Example 1), FIG. 10B (Example 2) and FIG. 10C (Comparative Example 1),

TABLE 2

|  | Adhesion | Corrosion |
| --- | --- | --- |
| Example 1 | 5B | No corrosion |
| Example 2 | 4B | Corrosion was partially observed |
| Comparative Example 1 | 3B | Corrosion was observed throughout an entire region of the electrode |

Figure 10A:
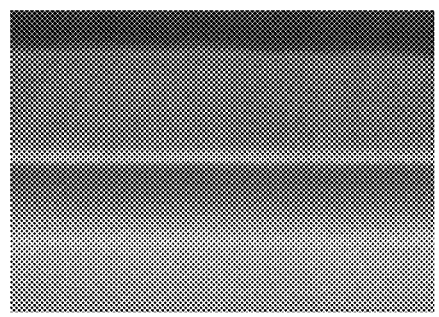
FIGS. 10A, 10B and 10C are SEM images showing electrodes of Example 1, Example 2 and Comparative Example 1, respectively, after an adhesion test.
Figure 10B:
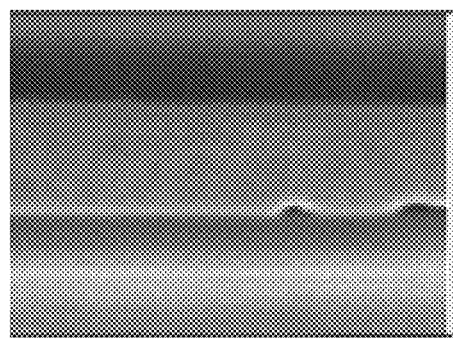
Figure 10C:
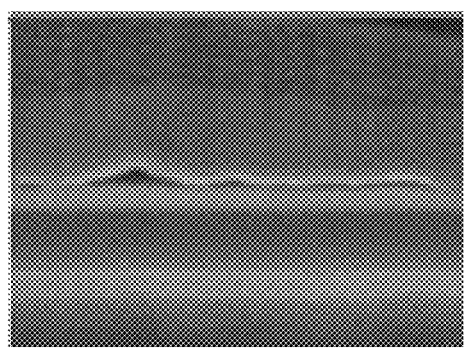

As shown in Table 2 and FIGS. 10A to 10C, adhesion and anti-corrosion properties were improved by the inclusion of conductive oxide layers, and more improved results were obtained in the electrode of Example 1 formed from the increased process temperature.

Experimental Example 3: Evaluation of Resistance

Comparative Example 2

In the process of Example 1, the oxygen injection was not interrupted to form an electrode formed of a Cu—Ca—O conductive oxide having a thickness of 2300 Å.

Sheet resistances of the electrodes of Examples 1 and 2 and Comparative Examples 1 and 2 were measured (Measuring device: NAPSON KOREA Semi-Automatic Resistivity Measuring Equipment). The results are shown in Table 3 below.

TABLE 3

|  | Sheet (Ω) | Ratio relative to Comparative Example 1 |
| --- | --- | --- |
| Example 1 | 0.120 | 1.12 |
| Example 2 | 0.129 | 1.21 |
| Comparative Example 1 | 0.107 | 1.00 |
| Comparative Example 2 | 0.179 | 1.67 |

Referring to Table 3, resistances in Examples 1 and 2 including the copper-containing metal layer were less than that in Comparative Example 2.

What is claimed is:

1. A touch sensor, comprising:
a substrate; and
a plurality of electrodes each of which is formed of a conductive stack structure comprising a first conductive oxide layer, a copper-containing metal layer and a second conductive oxide layer sequentially stacked from the substrate,
wherein each of the first conductive oxide layer and the second conductive oxide layer is a single copper-calcium oxide (Cu—Ca—O) layer;
the copper-containing metal layer is a copper-calcium (Cu—Ca) layer; and
the copper-containing metal layer is directly formed on the first conductive oxide layer, and the second conductive oxide layer is directly formed on the copper-containing metal layer.

2. The touch sensor according to claim 1, wherein the plurality of electrodes includes sensing electrodes and a bridge electrode electrically connecting neighboring ones of the sensing electrodes, and at least one of the sensing electrodes and the bridge electrode includes the conductive stack structure.

3. The touch sensor according to claim 2, wherein the sensing electrodes include:
first sensing electrodes arranged along a first direction parallel to a top surface of the substrate; and
second sensing electrodes integrally connected to each other along a second direction parallel to the top surface of the substrate and perpendicular to the first direction.

4. The touch sensor according to claim 3, further comprising an insulation layer at least partially covering the second sensing electrodes,
wherein the bridge electrode is disposed on the insulation layer to electrically connect the first sensing electrodes neighboring in the first direction to each other.

5. The touch sensor according to claim 4, wherein both the bridge electrode and the sensing electrodes include the conductive stack structure.

6. The touch sensor according to claim 3, further comprising an insulation layer partially covering the bridge electrode,
wherein the first sensing electrodes and the second sensing electrodes are disposed on the insulation layer, and the first sensing electrodes neighboring in the first direction are electrically connected to each other via a portion of the bridge electrode exposed through the insulation layer.

7. The touch sensor according to claim 6, wherein the bridge electrode includes the conductive stack structure, and the sensing electrodes include a transparent conductive oxide.

8. The touch sensor according to claim 2, wherein the plurality of electrodes further includes a trace electrically connected to the sensing electrodes and a pad connected to a terminal of the trace, and at least one of the trace and the pad includes the conductive stack structure.

9. The touch sensor according to claim 1, wherein each thickness of the first conductive oxide layer and the second conductive oxide layer is in a range from 100 Å to 600 Å, and a thickness of the copper-containing metal layer is in a range from 1000 Å to 3000 Å.

10. An image display device, comprising:
a display panel; and
the touch sensor of claim 1 on the display panel.

11. The image display device according to claim 10, further comprising an adhesive layer combining the display panel and the touch sensor with each other.

* * * * *